(12) United States Patent
Kwon et al.

(10) Patent No.: US 10,608,201 B2
(45) Date of Patent: Mar. 31, 2020

(54) FOLDABLE DISPLAY APPARATUS AND METHOD OF MANUFACTURING THE SAME

(71) Applicant: SAMSUNG DISPLAY CO., LTD., Yongin-si, Gyeonggi-do (KR)

(72) Inventors: Ohjune Kwon, Yongin-si (KR); Seungwook Kwon, Yongin-si (KR); Hyojeong Kwon, Yongin-si (KR); Doohwan Kim, Yongin-si (KR); Minsang Kim, Yongin-si (KR); Seungyong Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/284,252

(22) Filed: Feb. 25, 2019

(65) Prior Publication Data

US 2019/0280244 A1 Sep. 12, 2019

(30) Foreign Application Priority Data

Mar. 8, 2018 (KR) ........................ 10-2018-0027702

(51) Int. Cl.
*H01L 51/52* (2006.01)
*H01L 51/00* (2006.01)
*H01L 27/32* (2006.01)

(52) U.S. Cl.
CPC ...... *H01L 51/5253* (2013.01); *H01L 51/0097* (2013.01); *H01L 51/5237* (2013.01); *H01L 27/3244* (2013.01); *H01L 2251/5338* (2013.01)

(58) Field of Classification Search
CPC combination set(s) only.
See application file for complete search history.

(56) References Cited

U.S. PATENT DOCUMENTS

| | | | |
|---|---|---|---|
| 9,286,812 B2 * | 3/2016 | Bohn | G09F 9/301 |
| 9,348,362 B2 * | 5/2016 | Ko | G06F 1/1626 |
| 9,529,217 B1 | 12/2016 | Kim | |
| 9,541,962 B2 * | 1/2017 | Siddiqui | G06F 1/1618 |
| 9,651,998 B2 * | 5/2017 | Matsueda | G06F 1/1652 |
| 9,881,979 B2 * | 1/2018 | Sato | H01L 27/3244 |
| 9,910,458 B2 * | 3/2018 | Watanabe | G09F 9/00 |
| 10,001,810 B2 * | 6/2018 | Yoo | G06F 1/1626 |
| 10,025,355 B2 * | 7/2018 | Bohn | G09F 9/301 |
| 10,067,528 B2 * | 9/2018 | Lee | G06F 1/16 |
| 10,089,922 B2 * | 10/2018 | Lee | G09G 3/3225 |
| 10,121,978 B2 * | 11/2018 | Saeki | H05K 999/99 |
| 10,254,574 B2 * | 4/2019 | Tokuda | H05B 33/0806 |
| 2010/0246103 A1 * | 9/2010 | Visser | G06F 1/1616 361/679.01 |
| 2012/0314350 A1 * | 12/2012 | Choi | H04M 1/0202 361/679.01 |

(Continued)

FOREIGN PATENT DOCUMENTS

| | | |
|---|---|---|
| KR | 10-2015-0014713 A | 2/2015 |
| KR | 10-2016-0145230 A | 12/2016 |
| KR | 10-2017-0047713 A | 5/2017 |

*Primary Examiner* — Lisa Lea-Edmonds
(74) *Attorney, Agent, or Firm* — Lewis Roca Rothgerber Christie LLP (57) ABSTRACT

A foldable display apparatus includes a display panel that is foldable, and an expansion member located in a folding part of the display panel, the expansion member being expandable in response to stimulations.

19 Claims, 7 Drawing Sheets

(56) References Cited

U.S. PATENT DOCUMENTS

| | | |
|---|---|---|
| 2014/0240985 A1 | 8/2014 | Kim et al. |
| 2016/0204366 A1 | 7/2016 | Zhang et al. |
| 2017/0367173 A1 | 12/2017 | Park et al. |
| 2019/0074469 A1* | 3/2019 | Kwon .................... H01L 51/524 |
| 2019/0081256 A1* | 3/2019 | Kim .................... H01L 51/0097 |
| 2019/0131565 A1* | 5/2019 | Kwon ................. H01L 51/5246 |

* cited by examiner

FOLDABLE DISPLAY APPARATUS AND METHOD OF MANUFACTURING THE SAME

CROSS-REFERENCE TO RELATED APPLICATION

Korean Patent Application No. 10-2018-0027702, filed on Mar. 8, 2018, in the Korean Intellectual Property Office, and entitled: "Foldable Display Apparatus and Method of Manufacturing the Same," is incorporated by reference herein in its entirety.

BACKGROUND

1. Field

One or more embodiments relate to a foldable display apparatus having a foldable main body and a method of manufacturing the foldable display apparatus.

2. Description of the Related Art

A display apparatus such as an organic light-emitting display apparatus, which may be flexibly transformed, may be manufactured to have a flexible structure to improve the convenience of carrying or the curvature of a product.

SUMMARY

Embodiments are directed to a foldable display apparatus, including a display panel that is foldable, and an expansion member located in a folding part of the display panel, the expansion member being expandable in response to stimulations.

The expansion member may include an elastic pouch and an expansion material filling in the elastic pouch.

The expansion material is expandable in response to a stimulation, the stimulation being that is one of humidification, heating and pressurization.

The expansion material may include acrylic acid polymer salt.

The elastic pouch may be a cylinder-type pouch that autonomously provides a space to receive the expansion material.

The elastic pouch may be a cover-type pouch having two opposite ends attached to a protection film. The elastic pouch provides a space to receive the expansion material with the folding part of the display panel.

The foldable display apparatus may further include a protection film on a surface of the display panel, the protection film being foldable with the display panel, and an auxiliary layer on the protection film. The folding part in which the protection film is foldable may include a thin film zone in which the protection film is thinner than a main body of the protection film. The expansion member may be located in the thin film zone.

The auxiliary layer may include a radiation panel on the protection film and a cushion film on the radiation panel.

The foldable display apparatus may be foldable in a direction such that the expansion member is located on an inside and the display panel is outwardly exposed.

The expansion member, while expanding, may push the folding part of the display panel and may counter external forces applied inwardly.

Embodiments are also directed to a method of manufacturing a foldable display apparatus, including forming a protection film on a surface of a display panel that is foldable, removing a portion of the protection film corresponding to a folding part of the display panel to a certain depth, such that a thin film zone in which the protection film is thinner than the protection film remains in the folding part, forming an auxiliary layer on a main body of the protection film, placing an expansion member that is expandable in response to certain stimulations in the thin film zone, folding the display panel having the folding part as a center, and expanding the expansion member.

Forming the thin film zone may include heating and melting a portion of the protection film that corresponds to the folding part using a heat block.

The expansion member may include an elastic pouch and an expansion material filling the elastic pouch.

The expansion material may be expandable in response to a stimulation, the stimulation being one of humidification, heating, and pressurization.

The expansion material may include an acrylic acid polymer salt.

The elastic pouch may be a cylinder-type pouch that autonomously provides a space to receive the expansion material.

The elastic pouch may be a cover-type pouch having two opposite ends attached to the protection film and providing a space to receive the expansion material with the thin film zone.

The auxiliary layer may include a radiation panel on the protection film and a cushioning film provided on the radiation panel.

The foldable display apparatus may be foldable in a direction such that the expansion member is located on an inside and the display panel is exposed outwardly.

The expansion member, while expanding, may push against the folding part of the display panel and counter external forces applied inwardly.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1A:
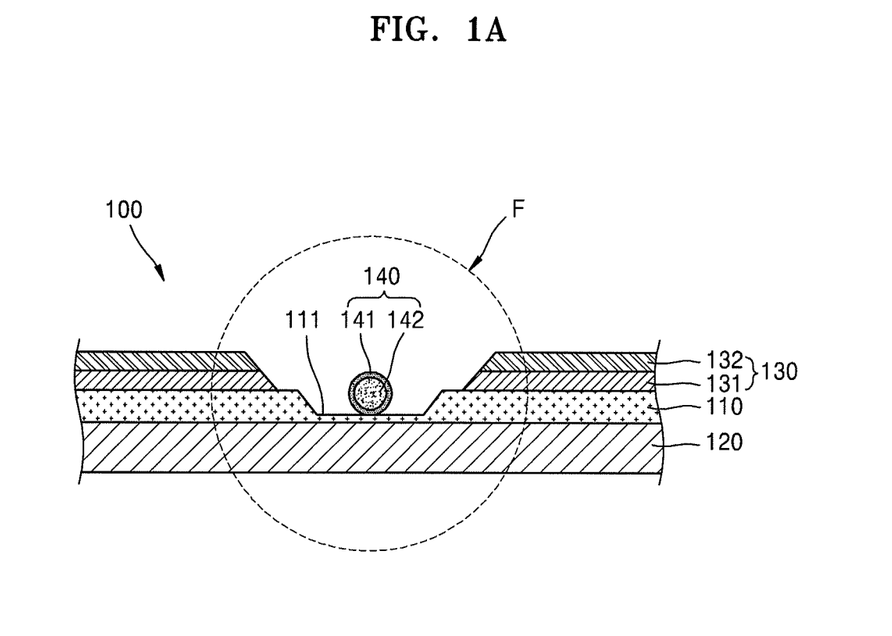
FIGS. 1A and 1B illustrate cross-sectional views respectively depicting an unfolded state and a folded state of a foldable display apparatus, according to an embodiment.
Figure 1B:
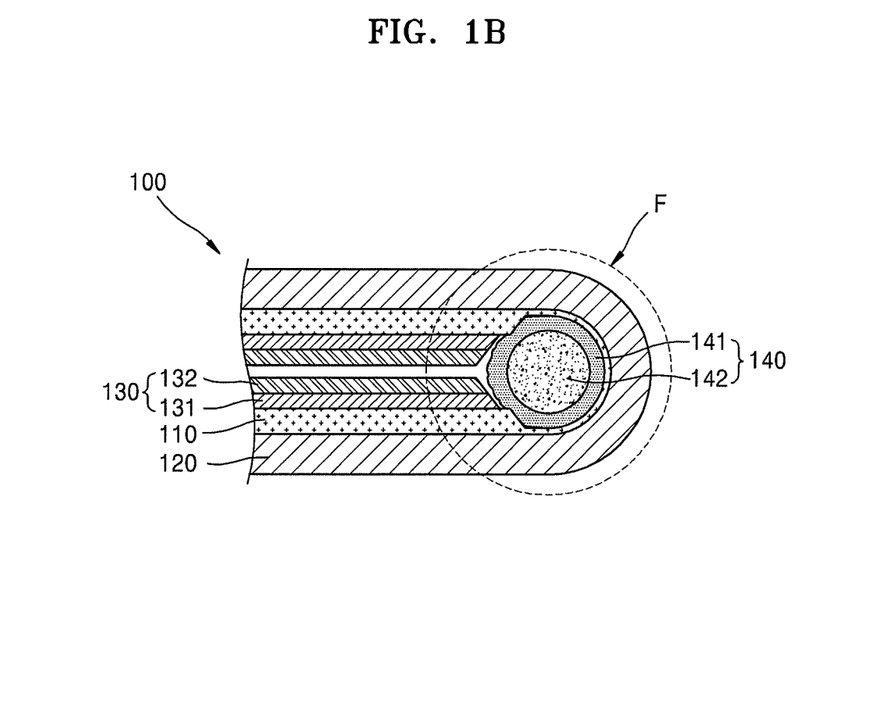

FIGS. 1A and 1B illustrate cross-sectional views respectively depicting an unfolded state and a folded state of a foldable display apparatus, according to an embodiment.

A foldable display apparatus 100 may include a display panel 120 that is foldable, a protection film 110 attached to a surface of the display panel 120, and an auxiliary layer 130 that includes a radiation panel 131 and a cushioning film 132 and is arranged on the protection film 110. The display panel 120 generally may have a stack structure including a thin film transistor and a light-emitting device to produce images, and an encapsulation layer, or the like, to cover and protect the thin film transistor and the light-emitting device. When a flexible substrate is used instead of an inflexible glass substrate, the display panel 120 may be arbitrarily folded and unfolded in an allowed range of flexibility. Accordingly, the display panel 120 may be folded into the folded state, as shown in FIG. 1B.

The display panel 120, when being folded, may be folded in a direction such that the display panel 120 faces outwardly and the auxiliary layer 130 and an expansion member 140, which will be described below, face inwardly. For example, the display panel 120 may be folded such that a lower surface shown in FIG. 1A, which is a surface in a direction in which the user views images, is exposed outwardly even after the display panel 120 is folded.

In a folding part F where the display panel 120 is folded, the protection film 110 may be removed to a certain depth such that the display panel 120 is more easily folded. A thickness of the protection film 110 may be decreased by removing a part corresponding to the folding part F such that the display panel 120 is more smoothly folded. The protection film 110 may not be completely removed, and a thin film zone 111 may remain. The formation of a discontinuous end that could form a starting point of delamination of the protection film 110 may be prevented. When the thickness of the protection film 110 in the folding part F is decreased such that the display panel 120 is more smoothly folded, the thin film zone 111 may be allowed to remain in order to prevent the formation of a discontinuous end that could be used as the starting point of delamination, peeling or blistering, and thus, delamination. peeling or blistering of the protection film 110 may be prevented.

Figure 2:
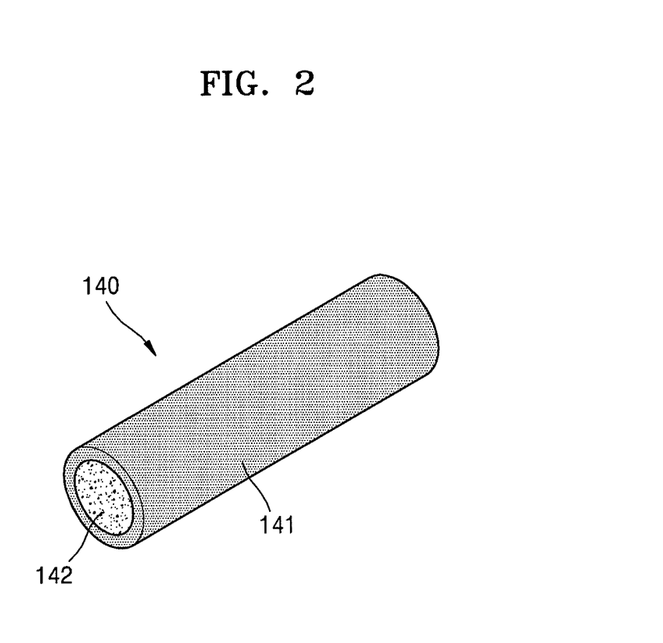
FIG. 2 illustrates a perspective view depicting an expansion member shown in FIG. 1A.

The expansion member 140 may be provided in the thin film zone 111. The expansion member 140, as illustrated in FIG. 2, may have a structure in which an expansion material 142 such as an acrylic acid polymer salt is filled in a cylinder-type elastic pouch 141 formed from rubber. Acrylic acid polymer salt, which is a humidification type expansion material, may be expandable to a range from about 700% to about 900%. Before the display panel 120 is folded, the expansion member 140 may be in a shrunken state. In a humidied state after the display panel 120 is folded, the expansion member 140 may rapidly expand and completely fill an inner space in the folding part F. For example, by pushing the folding part F of the display panel 120 in an outer circumference direction such that the folding part F counters an external force being applied inwardly, the expansion member 140 may protect the folding part F from being severely crushed or broken. When the expansion member 140 firmly supports the inner space of the folding part F, undesirable effects such as breakage of the display panel 120 may be more efficiently prevented, and thus, a highly stable folded state may be secured.

Various materials that are expandable in response to external stimulations may be used as the expansion material. For example, a heating type expansion material that is expandable by heating, a pressurization type expansion material that is expandable at a high pressure state, or the like, may be used as the expansion material 142.

Details of processes of manufacturing a foldable display apparatus including the aforementioned expansion member 140 will be described below.

Figure 5A:
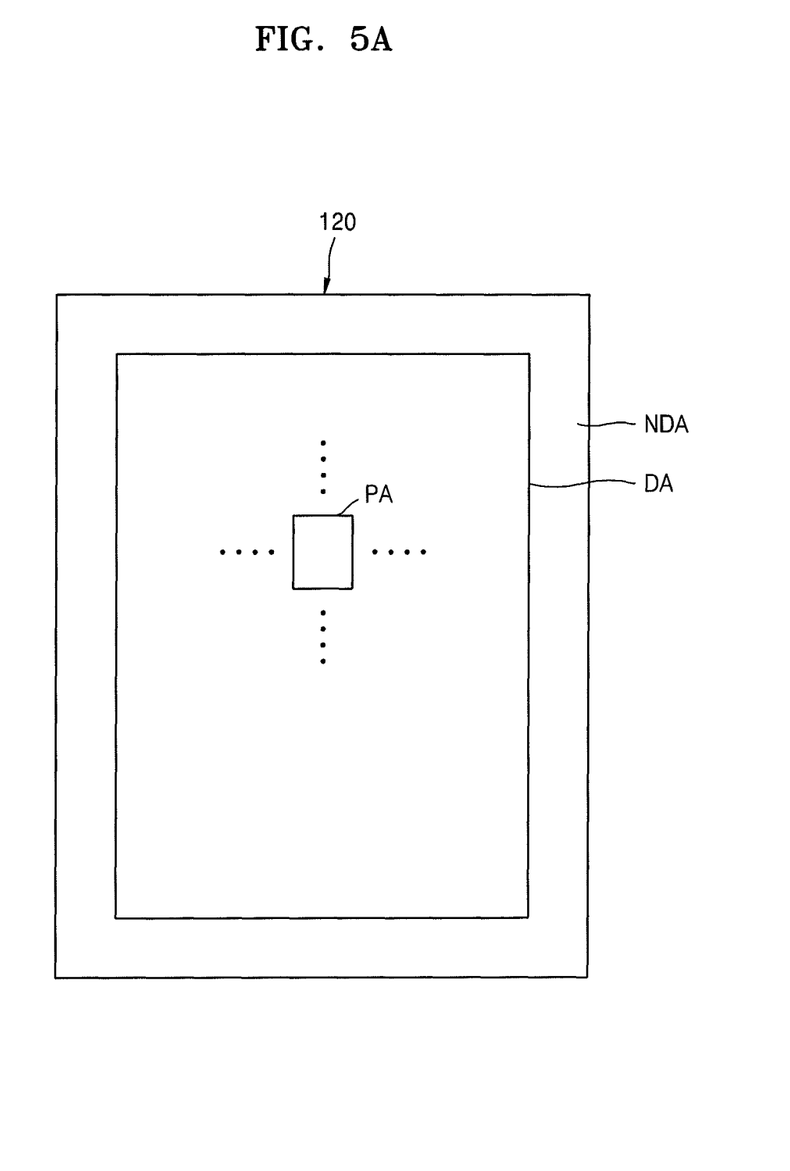
FIG. 5A illustrates a top-plan view of a display panel illustrated in FIG. 1A.

FIG. 5A schematically illustrates a plane structure of the display panel 120 that includes a display area DA displaying images and a non-display area NDA adjacent to the display area DA. The display area DA may include a plurality of pixel areas PA. A pixel that emits light may be formed in each of the pixel areas PA. Images may be provided by light emitted by a plurality of pixels included in the display area DA.

The non-display area NDA may surround the display area DA. The non-display area NDA may include a driving unit, for example, a scan driving unit and a data driving unit to transmit certain signals to the plurality of pixels provided in the display area DA.

In some implementations, the non-display area NDA may be arranged at a side of the display area DA such that an area in which images are not displayed, that is, a dead area, is decreased.

Figure 5B:
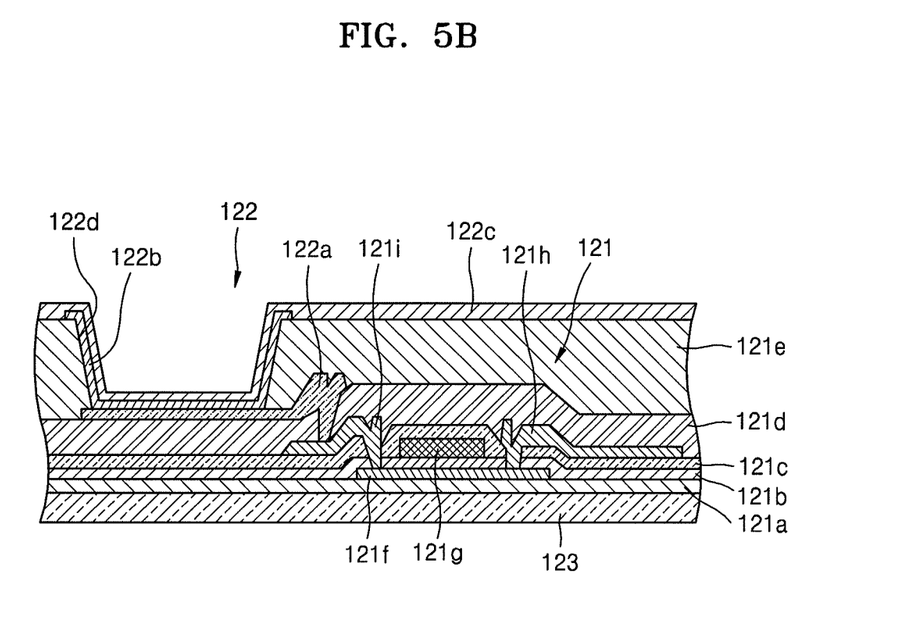
FIG. 5B illustrates a cross-sectional view depicting an interior structure of the display panel shown in FIG. 5A.

As shown in FIG. 5B, a thin film transistor 121 and an organic light-emitting device 122 may be provided in a pixel area PA of the display area DA. In a structure of the thin film transistor 121, a buffer layer 121$a$ may be formed on a substrate 123 that is flexible. For example, the substrate 123 may be formed from polyimide. An active layer 121$f$ may be formed on the buffer layer 121$a$. The active layer 121$f$ may include a source area and a drain area respectively doped with an N-type impurity or a P-type impurity to be highly concentrated. The active layer 121$f$ may include an oxide semiconductor. For example, the oxide semiconductor may include an oxide of at least one material of Groups 12, 13, and 14 metal elements, for example, zinc (Zn), indium (In), gallium (Ga), tin (Sn), cadmium (Cd), or germanium (Ge) or combinations thereof. For example, a semiconductor active layer 212 may include G-I-Z-O[$(In_2O_3)_a(Ga_2O_3)_b(ZnO)_c$] (a, b, and c respectively are real numbers satisfying a≥0, b≥0, and c>0). A gate electrode 121$g$ may be formed above the active layer 121$f$. A gate insulating layer 121$b$ may be between the active layer 121$f$ and the gate electrode 121$g$. A source electrode 121$h$ and a drain electrode 121$i$ are formed above the gate electrode 121$g$. An interlayer insulating layer 121$c$ may be provided between the gate electrode 121$g$, the source electrode 121, and the drain electrode 121$i$. A passivation layer 121$d$ may be provided between the source electrode 121$h$, the drain electrode 121$i$, and an anode electrode 122$a$ included in the organic light-emitting device 122.

An insulating planarization layer 121$e$ including, for example, acryl, may be formed on the anode electrode 122$a$. After forming an opening 122$d$ in the planarization layer 121$e$, the organic light-emitting device 122 may be formed.

The organic light-emitting device 122, which displays image data by emitting red, green, and blue light according to, for example, current flow, may include the anode electrode 122a connected to the drain electrode 121i in the thin film transistor 121. The anode electrode 122a may receive positive power from the drain electrode 121i. A cathode electrode 122c may cover all of the pixels and supply negative power thereto. An emission layer 122b may be between the anode electrode 122a and the cathode electrode 122c and may emit light.

A hole injection layer (HIL), a hole transport layer (HTL), an electron transport layer (ETL), and an electron injection layer (EIL) may be stacked adjacent to the emission layer 122b.

The emission layer 122b may be formed for each pixel such that pixels respectively emitting red, green, and blue lights may collectively form a unit pixel. In some implementations, regardless of positions of the pixels, an emission layer may be formed in one body in an entire pixel area. The emission layer may be formed by vertically stacking or mixing layers including luminous materials emitting, for example, red, green, and blue lights. When the emission layer emits white light, it may also be possible to combine other colors with one another. In addition, the emission layer may further include a color conversion layer converts the white light into a certain color, or a color filter.

A thin film encapsulation layer in which organic layers and inorganic layers are alternately stacked may be formed on the cathode electrode 122c.

A display panel 120 having the aforementioned structure, and which is flexible and easily folded, may be used as a foldable display apparatus.

A method of manufacturing the foldable display apparatus may be as follows.

Figure 3A:
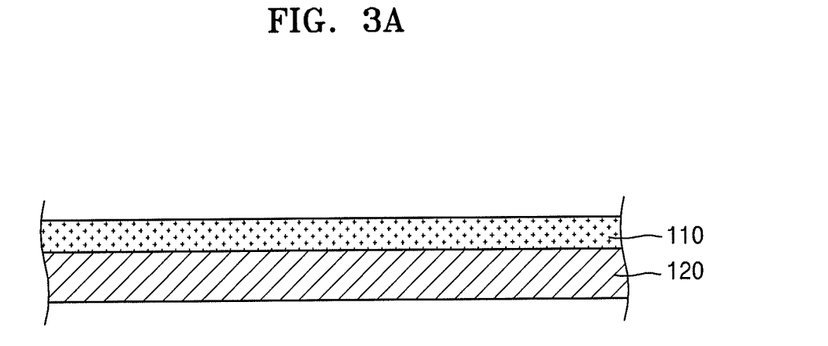
FIGS. 3A through 3E illustrate cross-sectional views consecutively depicting stages of a process of manufacturing the foldable display apparatus shown in FIGS. 1A and 1B.

As shown in FIG. 3A, the protection film 110 may be attached to a surface of the display panel 120. The protection film 110 may be formed from polyethylene terephthalate (PET).

Figure 3B:
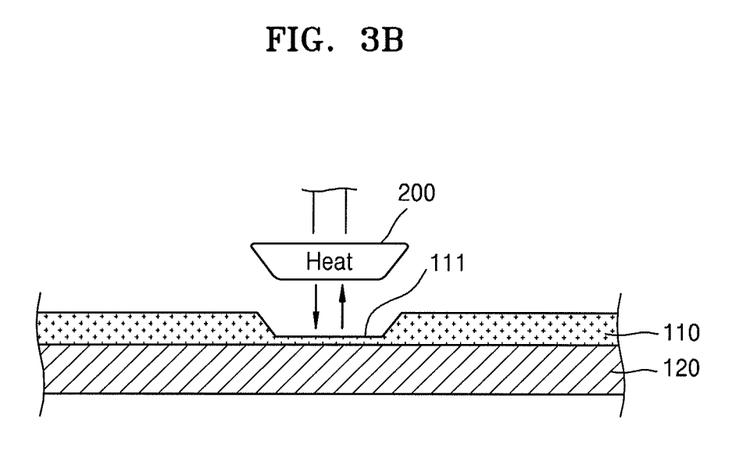

As shown in FIG. 3B, by having a heat block 200 that is a heating element for the folding part F contact the protection film 110, an area of the protection film 110 contacted by the heat block 200 may be melted and removed. The protection film 110 may not be entirely melted and removed, and a thin film zone 111 having a thickness that is less than that of the protection film 110 may remain. The heat block 200 may be a heating element heated from about, for example, 400° C. to about 520° C. for a unit time period. The thickness of the thin film zone 111 may be adjusted by changing a contact pressure applied to the protection film 110 by the heat block 200.

Figure 3C:
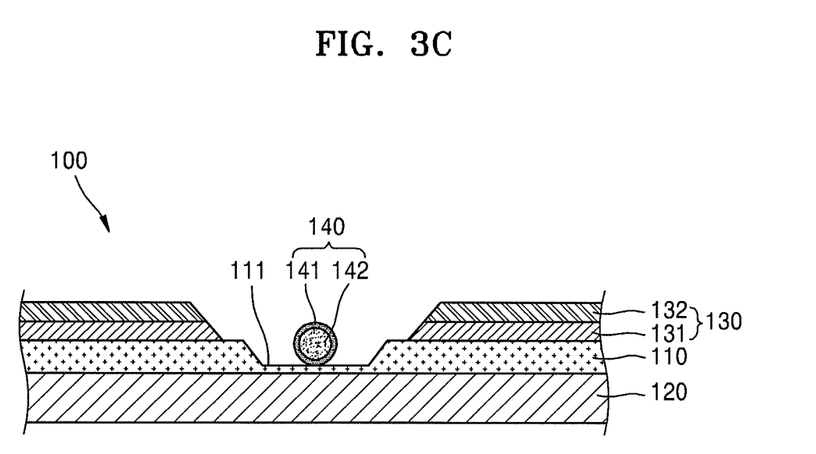

As shown in FIG. 3C, after the thin film zone 111 is formed using the aforementioned method, the auxiliary layer 130 including the radiation panel 131 and the cushioning film 132 may be arranged on a main body of the protection film 110, and the expansion member 140 is arranged in the thin film zone 111. The expansion member 140 may be attached and fixed at a certain part of the thin film zone 111 or may simply be put on the thin film zone 111.

Figure 3D:
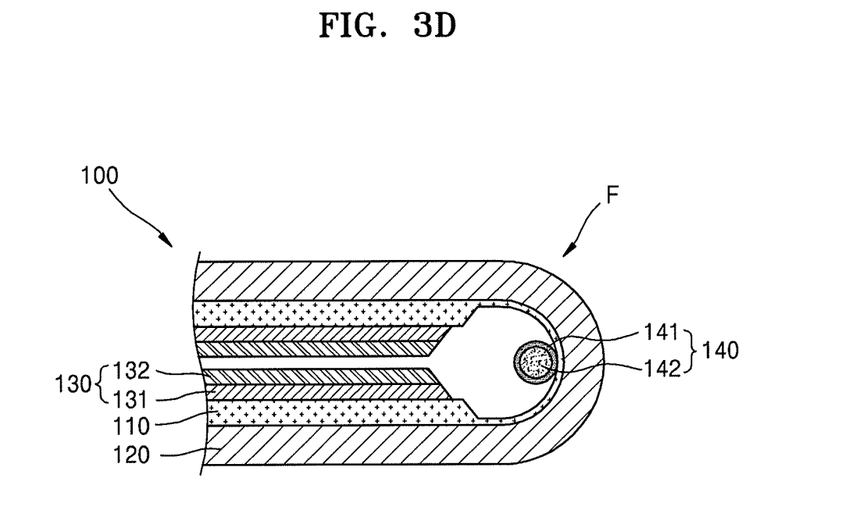

In this state, the display apparatus 100 is folded as shown in FIG. 3D, and moisture may be provided for the expansion member 140 to expand.

Figure 3E:
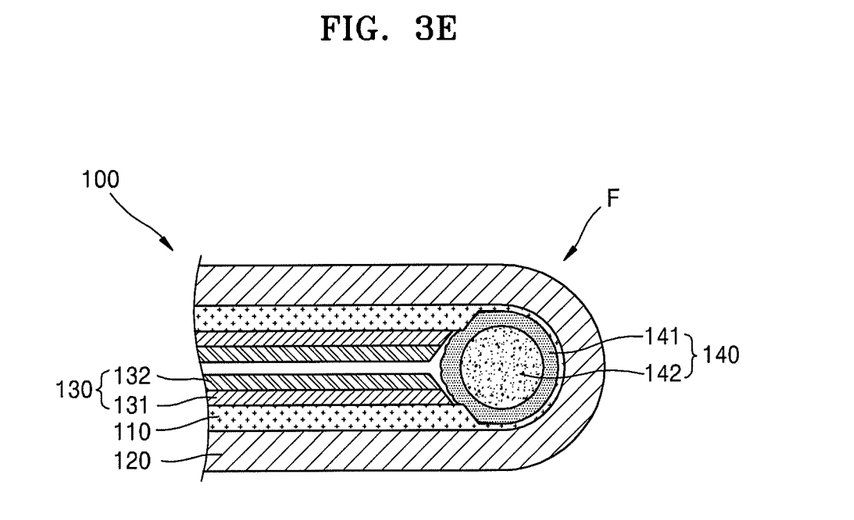

By doing so, the expansion material 142 in the expansion member 140 having humidity may rapidly expand and fill the inner space of the folding part F, as shown in FIG. 3E. The folding part F may maintain a firm supporting state to counter external forces. For example, an inner area of the folding part F is not empty and the expansion member 140 may firmly support the folding part F while pushing the folding part F outwardly. Accordingly, it may be possible to prevent for example, damaging wires of the display panel 120 that could occur if the folding part F were to be crushed due to an external force. Accordingly, folding operations may be stabilized by reducing the danger of damaging wires, and consequently, quality and reliability of the display apparatus 100 may be improved.

Figure 4A:
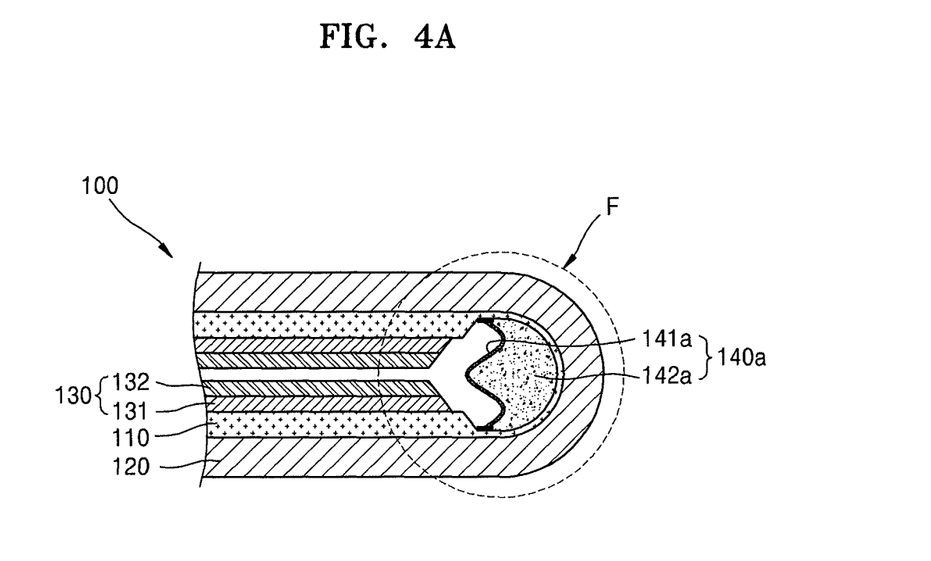
FIGS. 4A and 4B illustrate cross-sectional views depicting forms into which the expansion member of FIG. 2 may be transformed.
Figure 4B:
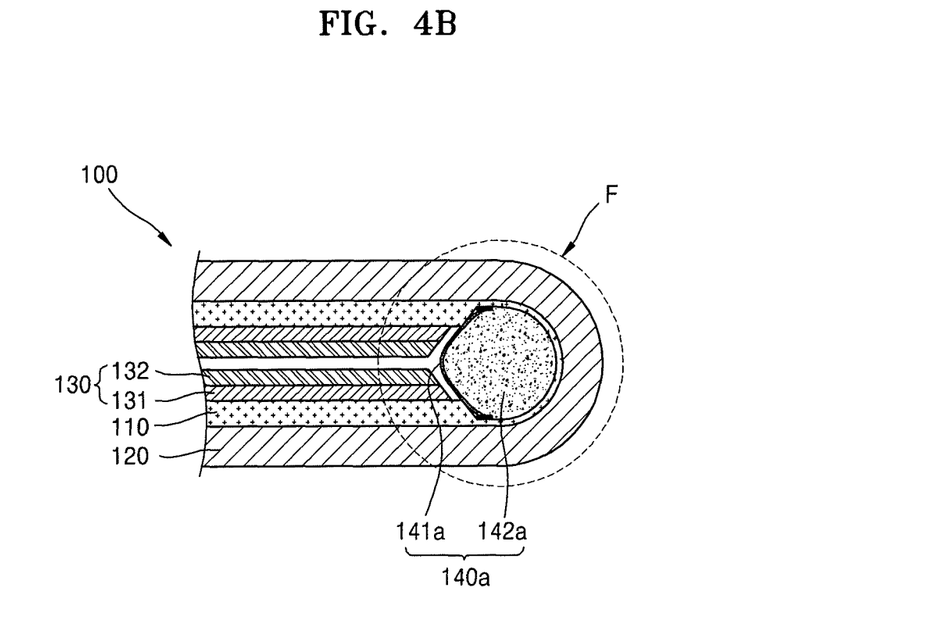

In some implementations, a cover-type pouch 141a forming a space for receiving an expansion material 142a with the folding part F of the display panel 120, as shown in FIGS. 4A and 4B, may be used. For example, when two opposite ends of the cover-type pouch 141a are attached to the protection film 110 in the folding part F of the display panel 120, the space for receiving the expansion material 142 may be formed between the cover-type pouch 141a and the folding part F. An expansion member 140a may be formed by filling the expansion material 142a in the space. Likewise, after folding the display panel 120, as shown in FIG. 4A, and when performing at least one of humidification, heating, and pressurization according to features of the expansion material 142a, the expansion member 140a may expand as shown in FIG. 4B and may firmly supports the inner space of the folding part F. Accordingly, by reducing the danger of damaging wires, folding operations may be stabilized. In this case, the cover-type pouch 141a and the expansion material 142a may include materials that are the same as those used in the aforementioned embodiments.

By way of summation and review, when a foldable display apparatus is kept folded for a long period of time, there is a possibility that a folding part of the foldable display apparatus could become severely crushed without maintaining a smooth round form. Thus, wires in the display apparatus could be damaged due to external forces.

Embodiments provide a foldable display apparatus and a method of manufacturing the same, such that the folding part may be firmly supported by the supporting unit and damage to the wires may be efficiently prevented, and thus, quality of products may be stably maintained.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A foldable display apparatus, comprising
a display panel that is foldable, and
an expansion member located in a folding part of the display panel, the expansion member being expandable in response to stimulations, wherein the expansion member includes an elastic pouch and an expansion material filling in the elastic pouch.

2. The foldable display apparatus as claimed in claim 1, wherein: the expansion material is expandable in response to a stimulation, the stimulation being one of humidification, heating and pressurization.

3. The foldable display apparatus as claimed in claim 1, wherein: the expansion material includes an acrylic acid polymer salt.

4. The foldable display apparatus as claimed in claim 1, wherein:
the elastic pouch is a cylindrical pouch that autonomously provides a space to receive the expansion material.

5. The foldable display apparatus as claimed in claim 1, wherein:
the elastic pouch is a cover-type pouch having two opposite ends attached to a protection film and
the elastic pouch provides a space to receive the expansion material within the folding part of the display panel.

6. The foldable display apparatus as claimed in claim 1, further comprising:
a protection film on a surface of the display panel, the protection film being foldable with the display panel, and
an auxiliary layer arranged on the protection film, wherein:
the folding part in which the protection film is foldable includes a thin film zone in which the protection film is thinner than a main body of the protection film, and
the expansion member is located in the thin film zone.

7. The foldable display apparatus as claimed in claim 6, wherein:
the auxiliary layer includes a radiation panel on the protection film and a cushion film on the radiation panel.

8. The foldable display apparatus as claimed in claim 1, wherein:
the foldable display apparatus is foldable in a direction such that the expansion member is located on an inside of the folded display apparatus and the display panel is outwardly exposed.

9. The foldable display apparatus as claimed in claim 1, wherein:
the expansion member, while expanding, pushes the folding part of the display panel and counters external forces applied inwardly.

10. A method of manufacturing a foldable display apparatus, the method comprising:
forming a protection film on a surface of a display panel that is foldable;
removing a portion of the protection film corresponding to a folding part of the display panel to a certain depth, such that a thin film zone in which the protection film is thinner than the protection film remains in the folding part;
forming an auxiliary layer on a main body of the protection film;
placing an expansion member that is expandable in response to stimulation in the thin film zone;
folding the display panel having the folding part as a center; and
expanding the expansion member.

11. The method as claimed in claim 10, wherein:
forming the thin film zone includes heating and melting a portion of the protection film that corresponds to the folding part using a heat block.

12. The method as claimed in claim 10, wherein:
the expansion member includes an elastic pouch and an expansion material filled in the elastic pouch.

13. The method as claimed in claim 12, wherein:
the expansion material is expandable in response to a stimulation, the stimulation being one of humidification, heating, and pressurization.

14. The method as claimed in claim 13, wherein: the expansion material includes an acrylic acid polymer salt.

15. The method as claimed in claim 12, wherein:
the elastic pouch is a cylindrical pouch that autonomously provides a space to receive the expansion material.

16. The method as claimed in claim 12, wherein:
the elastic pouch is a cover-type pouch having two opposite ends attached to the protection film and providing a space to receive the expansion material within the thin film zone.

17. The method as claimed in claim 10, wherein:
the auxiliary layer includes a radiation panel on the protection film and a cushion film provided on the radiation panel.

18. The method as claimed in claim 10, wherein:
the foldable display apparatus is foldable in a direction such that the expansion member is located on an inside of the folded display apparatus and the display panel is exposed outwardly.

19. The method as claimed in claim 10, wherein:
the expansion member, while expanding, pushes against the folding part of the display panel and counters external forces applied inwardly.

* * * * *